United States Patent [19]
Henning et al.

[11] Patent Number: 5,835,430
[45] Date of Patent: Nov. 10, 1998

[54] METHOD OF PROVIDING REDUNDANCY IN ELECTRICALLY ALTERABLE MEMORIES

[75] Inventors: Jerrold V. Henning, Anaheim; Dennis E. Starbuck, Fountain Valley, both of Calif.

[73] Assignee: Rockwell International Corporation, Newport Beach, Calif.

[21] Appl. No.: 900,262

[22] Filed: Jul. 25, 1997

[51] Int. Cl.[6] ............................. G11C 7/00; G11C 16/06
[52] U.S. Cl. .................... 365/201; 365/200; 365/185.9; 371/10.2
[58] Field of Search ................................ 365/201, 200, 365/185.09; 395/182.03; 371/10.2

[56] References Cited

U.S. PATENT DOCUMENTS

| | | | |
|---|---|---|---|
| 5,473,753 | 12/1995 | Wells et al. | 395/182.03 |
| 5,524,231 | 6/1996 | Brown | 365/185.09 |
| 5,642,307 | 6/1997 | Jernigan | 365/201 X |
| 5,671,229 | 9/1997 | Harari et al. | 365/200 X |

*Primary Examiner*—Huan Hoang
*Attorney, Agent, or Firm*—William C. Cray; Philip K. Yu

[57] ABSTRACT

A method of providing redundancy in an electrically alterable memory divided into addressable blocks within the memory. The electrically alterable memory should have more available blocks than required by the firmware. The method includes the steps of testing the memory to create block status information about good versus bad blocks, writing the block status information into a table in the electrically alterable memory, reordering the table so that contiguous series of entries in the table point only to good blocks, and then providing a block status array comprising block select registers which are initialized with the corresponding ones of the contiguous series of entries so that a nominal address to a bad block is redirected to a good block.

9 Claims, 8 Drawing Sheets

| BSR # | ADDRESS | E53 | E52 | E51 | E50 | BA3 | BA2 | BA1 | BA0 |
|---|---|---|---|---|---|---|---|---|---|
| 7 | $001F | | | | | | | | |
| 6 | $001E | | | | | | | | |
| 5 | $001D | | | | | | | | |
| 4 | $001C | | | | | | | | |
| 3 | $001B | | | | | | | | |
| 2 | $001A | | | | | | | | |
| 1 | $0019 | | | | | | | | |
| 0 | $0018 | | | | | | | | |

| ADDRESS | STATUS BITS | BLOCK ID BITS | |
|---|---|---|---|
| $1C80F | 0000 | 1111 ($F) | |
| $1C80E | 0000 | 1110 ($E) | |
| $1C80D | 0000 | 1101 ($D) | |
| $1C80C | 0000 | 1100 ($C) | |
| $1C80B | 0000 | 1011 ($B) | |
| $1C80A | 0000 | 1010 ($A) | |
| $1C809 | 0000 | 1001 ($9) | |
| $1C808 | 0000 | 1000 ($8) | |
| $1C807 | 0000 | 0111 ($7) | 96K |
| $1C806 | 0000 | 0110 ($6) | |
| $1C805 | 0000 | 0101 ($5) | |
| $1C804 | 0000 | 0100 ($4) | |
| $1C803 | 0000 | 0011 ($3) | |
| $1C802 | 0000 | 0010 ($2) | |
| $1C801 | 0000 | 0001 ($1) | |
| $1C800 | 0000 | 0000 ($0) | |

| BSR # | ADDRESS | E53 | E52 | E51 | E50 | BA3 | BA2 | BA1 | BA0 |
|---|---|---|---|---|---|---|---|---|---|
| 7 | $001F | | | | | | | | |
| 6 | $001E | | | | | | | | |
| 5 | $001D | | | | | | | | |
| 4 | $001C | | | | | | | | |
| 3 | $001B | | | | | | | | |
| 2 | $001A | | | | | | | | |
| 1 | $0019 | 1 | 1 | 1 | 1 | 0 | 0 | 0 | 1 |
| 0 | $0018 | | | | | | | | |

*Fig. 4.*

| ADDRESS | STATUS BITS | BLOCK ID BITS | |
|---|---|---|---|
| $1C80F | 0000 | 1111 ($F) | |
| $1C80E | 0000 | 1110 ($E) | |
| $1C80D | 0000 | 1101 ($D) | |
| $1C80C | 0000 | 1100 ($C) | |
| $1C80B | 0000 | 1011 ($B) | |
| $1C80A | 0000 | 1010 ($A) | |
| $1C809 | 0000 | 1001 ($9) | |
| $1C808 | 0000 | 1000 ($8) | |
| $1C807 | 0000 | 0111 ($7) | |
| $1C806 | 1000 | 0110 ($6) | 96K |
| $1C805 | 0000 | 0101 ($5) | |
| $1C804 | 0000 | 0100 ($4) | |
| $1C803 | 0000 | 0011 ($3) | |
| $1C802 | 0000 | 0010 ($2) | |
| $1C801 | 0000 | 0001 ($1) | |
| $1C800 | 0000 | 0000 ($0) | |

*Fig. 5A.*

| ADDRESS | STATUS BITS (32) | BLOCK ID BITS (31) |
|---|---|---|
| $1C80F | 0000 | 1111($F) |
| $1C80E | 0000 | 1110($E) |
| $1C80D | 1000 | 0110($6) |
| $1C80C | 0000 | 1100($C) |
| $1C80B | 0000 | 1011($B) |
| $1C80A | 0000 | 1010($A) |
| $1C809 | 0000 | 1001($9) |
| $1C808 | 0000 | 1000($8) |
| $1C807 | 0000 | 0111($7) |
| $1C806 | 0000 | 1101($D) |
| $1C805 | 0000 | 0101($5) |
| $1C804 | 0000 | 0100($4) |
| $1C803 | 0000 | 0011($3) |
| $1C802 | 0000 | 0010($2) |
| $1C801 | 0000 | 0001($1) |
| $1C800 | 0000 | 0000($0) |

30
96K

_Fig. 5B._

50

| BSR# | ADDRESS | ES3 | ES2 | ES1 | ES0 | BA3 | BA2 | BA1 | BA0 |
|---|---|---|---|---|---|---|---|---|---|
| 7 | $001F | | | | | | | | |
| 6 | $001E | 1 | 1 | 1 | 1 | 1 | 1 | 0 | 1 |
| 5 | $001D | | | | | | | | |
| 4 | $001C | | | | | | | | |
| 3 | $001B | | | | | | | | |
| 2 | $001A | | | | | | | | |
| 1 | $0019 | | | | | | | | |
| 0 | $0018 | | | | | | | | |

_Fig. 6._

FIG. 7A.

| ADDRESS | STATUS BITS (32) | BLOCK ID BITS (31) |
|---|---|---|
| $1C80F | 0000 | 1111($F) |
| $1C80E | 0000 | 1110($E) |
| $1C80D | 0000 | 1101($D) |
| $1C80C | 0000 | 1100($C) |
| $1C80B | 0000 | 1011($B) |
| $1C80A | 0000 | 1010($A) |
| $1C809 | 1000 | 1001($9) |
| $1C808 | 0000 | 1000($8) |
| $1C807 | 0000 | 0111($7) |
| $1C806 | 0000 | 0111($6) |
| $1C805 | 0000 | 0101($5) |
| $1C804 | 0000 | 0100($4) |
| $1C803 | 0000 | 0011($3) |
| $1C802 | 0011 | 0010($2) |
| $1C801 | 0000 | 0001($1) |
| $1C800 | 0000 | 0000($0) |

FIG. 7B.

| ADDRESS | STATUS BITS (32) | BLOCK ID BITS (31) |
|---|---|---|
| $1C80F | 0000 | 1111($F) |
| $1C80E | 0000 | 1110($E) |
| $1C80D | 0011 | 0010($2) |
| $1C80C | 0000 | 1100($C) |
| $1C80B | 0000 | 1011($B) |
| $1C80A | 0000 | 1010($A) |
| $1C809 | 1000 | 1001($9) |
| $1C808 | 0000 | 1000($8) |
| $1C807 | 0000 | 0111($7) |
| $1C806 | 0000 | 0110($6) |
| $1C805 | 0000 | 0101($5) |
| $1C804 | 0000 | 0100($4) |
| $1C803 | 0000 | 0011($3) |
| $1C802 | 0000 | 1101($D) |
| $1C801 | 0000 | 0001($1) |
| $1C800 | 0000 | 0000($0) |

| ADDRESS | STATUS BITS | BLOCK ID BITS |
|---|---|---|
| $1C80F | 0000 | 1111($F) |
| $1C80E | 0000 | 1110($E) |
| $1C80D | 0011 | 0010($2) |
| $1C80C | 1000 | 0111($9) |
| $1C80B | 0000 | 1011($B) |
| $1C80A | 0000 | 1010($A) |
| $1C809 | 0000 | 1100($C) |
| $1C808 | 0000 | 1000($8) |
| $1C807 | 0000 | 0111($7) |
| $1C806 | 0000 | 0110($6) |
| $1C805 | 0000 | 0101($5) |
| $1C804 | 0000 | 0100($4) |
| $1C803 | 0000 | 0011($3) |
| $1C802 | 0000 | 1101($D) |
| $1C801 | 0000 | 0001($1) |
| $1C800 | 0000 | 0000($0) |

FIG. 7C.

| BSR # | ADDRESS | E53 | E52 | E51 | E50 | BA3 | BA2 | BA1 | BA0 |
|---|---|---|---|---|---|---|---|---|---|
| 7 | $001F | | | | | | | | |
| 6 | $001E | | | | | | | | |
| 5 | $001D | | | | | | | | |
| 4 | $001C | | | | | | | | |
| 3 | $001B | | | | | | | | |
| 2 | $001A | | | | | | | | |
| 1 | $0019 | 1 | 1 | 1 | 1 | 1 | 1 | 0 | 0 |
| 0 | $0018 | | | | | | | | |

FIG. 8.

METHOD OF PROVIDING REDUNDANCY IN ELECTRICALLY ALTERABLE MEMORIES

BACKGROUND OF THE INVENTION

1. Field of the Invention

The present invention generally relates to electrically alterable memories and more particularly, to a method of providing redundancy in such memories by testing the memories after manufacture and creating a status table in an unused portion of the electrically alterable memory containing the identity of good versus bad memory blocks and then initializing block select registers based on the contents of the status table so that a single version of application code that was compiled assuming contiguous memory addresses may be loaded and executed within good blocks in the electrically alterable memory without having to separately compile the application code for each possible pattern of good and bad blocks.

2. Description of Related Art

Modern electronic devices are frequently controlled by a microprocessor or central processing unit (CPU) which executes compiled application code or firmware within memory. Electrically alterable memories such as EEPROM's, FLASH, and RAM memories are popular because they are easily programmed and modified in the field. The first two, moreover, are nonvolatile. Some form of redundancy is generally necessary in all memories in order to guarantee sufficient device yield in the presence of normal device defects. Redundancy can be in the form of extra rows or columns in a memory array, for example, wherein the extra row or extra column can be switched in to replace a bad row or column. The use of redundant rows or columns, however, typically requires that the physical memory address be checked at each access to determine if there is a bad location. This results in slower memory access performance for all accesses.

Redundancy has also previously been provided in the form of extra blocks of memory to replace bad blocks. The known redundancy methods using extra blocks, however, are not well suited to high volume application because of complications in controlling the use of good and bad memory during code installation and execution. In general, the known methods of using extra memory blocks require testing the memories subsequent to manufacture to find "good" chips that have enough "good" blocks to accommodate the firmware; sorting the good chips into groups of chips with no bad blocks, chips with bad block number one, chips with bad block number two, and so on; compiling the application code into different "block-specific" versions that "know about" a particular bad block, or blocks, so that the code will operate properly in each specific chip group; and then loading the block-specific object code into the memory of corresponding chip groups. This approach to increasing yield is very time consuming and expensive.

Accordingly, there is a need for a method of providing redundancy in an electrically alterable memory which eliminates the need for sorting the memory devices into various groups and for compiling codes around the bad blocks in such groups.

SUMMARY OF THE INVENTION

The method of the present invention provides redundancy in an electrically alterable memory divided into memory blocks for executing a program within the electrically alterable memory by testing the electrically alterable memory to classify each memory block as a good memory block or a bad memory block, and creating a block status table within the electrically alterable memory which contains identity information and status information about the memory blocks.

In use, the method further comprises the steps of providing a block select register for receiving the block identity information corresponding to a good memory block; transferring the block identity information from the block status table to the block select register; nominally addressing a memory block by setting bit values of a predetermined number of MSB's of an address bus controlled by a central processing unit executing a program that assumes that the nominally addressed memory block is good; activating the block select register based on the bit values of the predetermined number of MSB's of the address bus; and outputting the block identity information of the activated block select register to address a good memory block instead of the nominally addressed memory block.

BRIEF DESCRIPTION OF THE DRAWINGS

FIG. 2 is a diagram of all eight of the block select registers BSR0–BSR7 in the preferred block select array 50 of FIG. 1;

FIG. 3 shows a first block status table 30 after testing an electronically alterable memory having no bad blocks;

FIG. 4 shows the block status array 50 with BSR1 initialized in accordance with entry 1 ($1C801) in the block status table 30 of FIG. 3;

FIG. 5A shows a block status table 30 after testing an electronically alterable memory having one bad block, block 6;

FIG. 5B shows the block status table 30 of FIG. 5A after reordering wherein bad block 6 has been swapped with good block D;

FIG. 6 shows the block status array 50 with BSR0 initialized in accordance with entry 6 ($1C806) in the block status table 30 of FIG. 5B;

FIG. 7A shows a block status table 30 after testing an electronically alterable memory having two bad blocks, block 2 and block 9;

FIG. 7B shows the block status table 30 of FIG. 7A after a first reordering wherein the first bad block, block 2, has been swapped with the highest available good block-block D;

FIG. 7C shows the block status table 30 of FIG. 5A after a second reordering wherein the next bad block, block 9, has been swapped with the next available good block-block C;

FIG. 8 shows the block status array 50 with BSR1 initialized in accordance with entry 9 ($1C809) in the block status table 30 of FIG. 7C;

BRIEF DESCRIPTION OF THE PREFERRED EMBODIMENT

Figure 1:
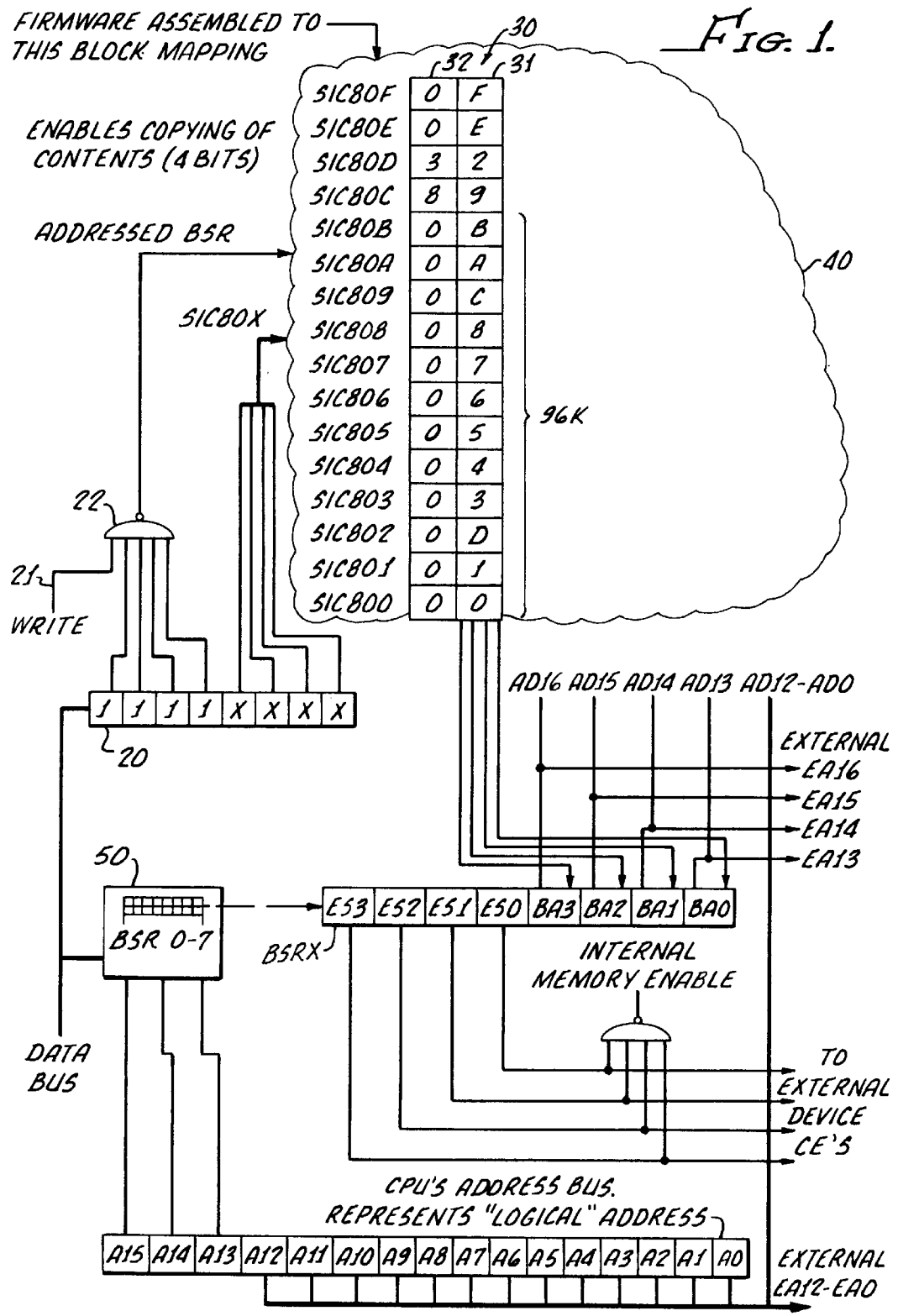
FIG. 1 is a schematic block diagram of a microcontroller system implementing the present invention wherein logical addresses A15, A14, A13 on a CPU's address bus are mapped to physical internal addresses AD16, AD15, AD14, AD13 or physical external addresses EA16, EA15, EA14, EA13 using a block select array 50 which cooperates with a block status table 30 contained in electrically alterable memory which may have "bad" blocks.

The present invention was created for use in a custom microcontroller designed for PCMCIA applications, but it could be implemented in various other devices which address an electrically alterable memory divided into equal sized memory blocks. As shown in FIG. 1, the microcontroller generally comprises a CPU having an address bus 10, a data bus 20, a write control line 21 and an internal memory space 40 corresponding to ROM, RAM, electrically alterable memory, CPU registers, I/O registers, and so on.

The system of FIG. 1 has a 16-bit address bus 10 with address lines A15–A0 that can nominally address only 64K bytes of memory. If the firmware were larger than 64K, say 96K, than some sort of bank switching scheme would be necessary. In a conventional bank switching scheme, the CPU's logical address space is divided into a desired number of blocks by decoding one or more of the MSB's on the CPU's address bus 10 to select the blocks (i.e. one bit for two blocks. two bits for four blocks, three bits for eight blocks, and so on). The MSB's are usually decoded to select one of a corresponding number of block select registers which the firmware uses to add at least one extra firmware controlled bit to the MSB's of the logical address to select blocks in two or more memory banks.

In FIG. 1, the inventors chose to divide the memory into eight 8K blocks and to provide eight corresponding block select registers BSR0–BSR7 that are located, as best shown in FIG. 2, at predetermined hexadecimal addresses such as $0018–$001F.

As shown, the preferred block select registers BSR0–BSR7 are eight bit registers. In our illustrated case, the three MSB's A15, A14, A13 on the CPU address bus 10 are decoded to select one of the eight block select registers BSR0–BSR7 in the block select array 50; 000x selecting BSR0, 001x selecting BSR1, 010x selecting BSR2, and so on.

The upper four bits of each BSR are used as external select bits ES3, ES2, ES1, ES0 because this particular microcontroller was intended to address external devices. Each external select bit ES3–ES0 drives a "chip enable" input of an external device. Since external devices are generally enabled "low," the inventors chose to set all of the external select bits ES3–ES0 "high" in order to distinguish an internal address from an external address and enable an addressed BSR with a NAND gate 22, for example, as shown in FIG. 1.

The lower four bits comprise block address bits BA3, BA2, BA1, BA0, that are firmware controlled to implement the bank switching scheme that overcomes the 64K limitation of a sixteen bit address bus 10. When the three MSBs of the address on the CPU bus 10 select a particular BSR, then the four block address values BA3–BA0 contained in that BSR are output as physical memory addresses AD16, AD15, AD14, AD13. As a result of this approach, the firmware can nominally address up to sixteen memory blocks per chip enable (4) or internally, eight blocks in a lower bank comprising memory block 0 to memory block 7 and eight blocks in an upper bank comprising memory block 8 to memory block 15.

Semiconductor manufacturing inherently results in varying yields so far as the operability of the electrically alterable memory is concerned. As explained above, the conventional practice of compiling the firmware for different patterns of good versus bad memory blocks, testing the memory to find identical groups of good versus bad blocks, and then loading different versions of the firmware into each group is time consuming and expensive. These inventors realized that the block select registers BSR0–BSR7 used for bank switching could also be used to uniquely substitute good blocks for bad blocks nominally addressed by the address bus 10. More specifically, the inventors realized that each electrically alterable memory could be tested to create a unique block status table 30 that could be used with the block select array 50 so that, in addition to simply implementing upper and lower 64K halves, nominal firmware calls to bad blocks could be transparently redirected to extra good blocks. In essence, the hardware would use the information in the block status table 30 to secretly modify the contents of registers in the block select array 50 so that "good" memory blocks will be substituted whenever the firmware tries to access a "bad" block. This makes it possible to use only one version of compiled firmware that was assembled without concern for bad memory blocks or, in other words, with the assumption that the CPU will load and execute the code within good memory blocks that are sequential.

Figure 9:
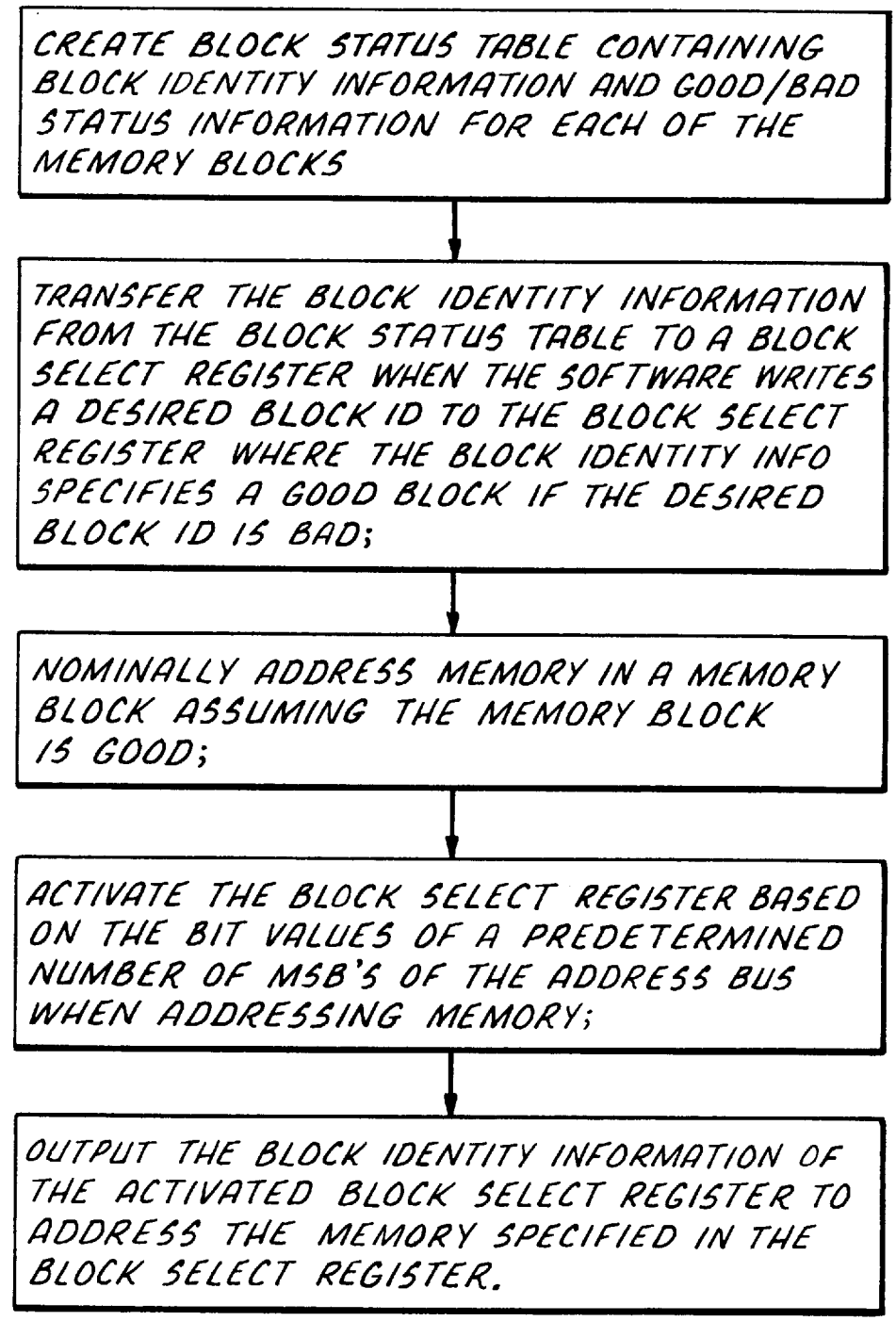
FIG. 9 is a flow chart describing a preferred method of substituting good blocks for bad blocks using a block status table in accordance with the present invention.
Figure 10:
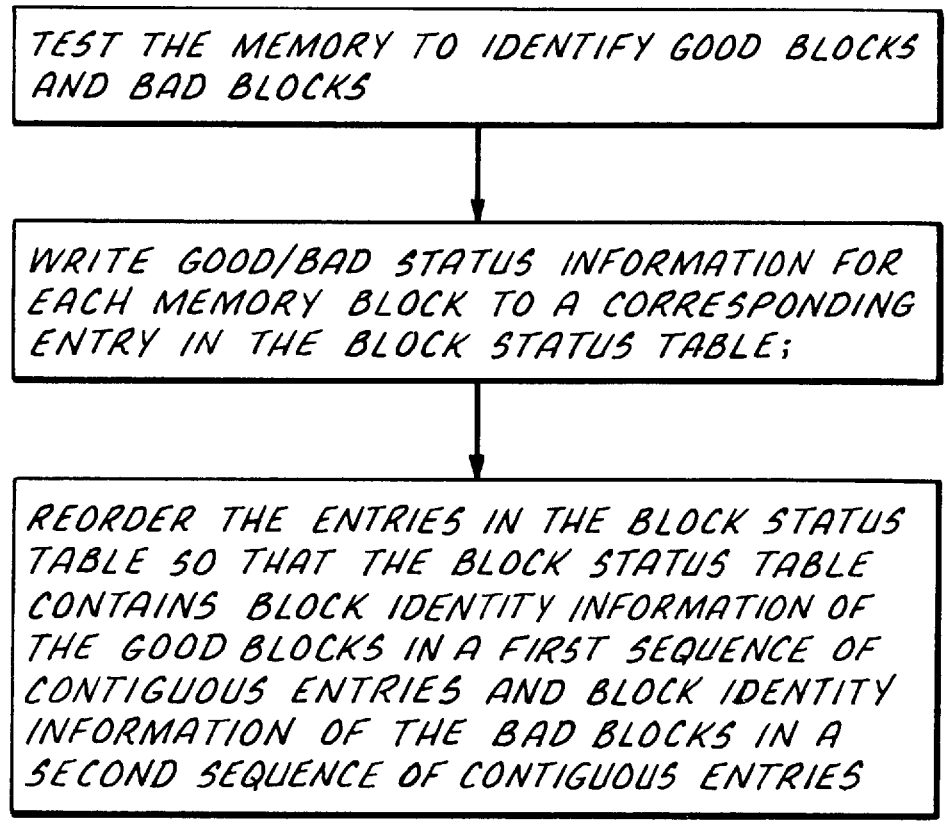
FIG. 10 is a flow chart describing a preferred method of creating the block status table.

As described in FIG. 9, the method involves creating a block status table for each memory and then, during the use of the device (below dashed line), initializing the block select registers BSR0–BSR7 in the block select array 50 to substitute good blocks for bad blocks. The block status table 30 is preferably created at the time of manufacture, as described in FIG. 10, by testing the electrically alterable memory to identify bad blocks, in whole or in part, writing to designated locations within an individual electrically alterable memory, and then reordering the information within the table 30 so that it may be used by the block select array 50. Significantly, as explained below, the block status table 30 will not unduly effect device performance because it is not used on every memory access, but only once when writing to initialize the block select array 50.

The invention, of course, requires an electrically alterable memory with more memory blocks than required by the firmware. There must be at least one extra block available in the event of a bad block. The more extra blocks available, the more bad blocks that can be accommodated. The invention could accommodate up to two bad blocks, for example, if the electrically alterable memory has fourteen memory blocks and the firmware only requires twelve.

The system of FIG. 1 is just such a system. It was designed to run a 96K program contained in an electrically alterable memory that is 104K in size. The program, therefore, requires twelve 8K blocks (block 0 to block B) whereas the electrically alterable memory has fourteen available 8K blocks (block 0 to block D). Blocks E and F are unavailable in this particular case, because block E contains the block substitution table 30 and block F is used for ROM.

As described above and suggested by FIG. 1, the three most significant bits of the logical address (A15 to A13) asserted on the CPU's address bus 10 select one of eight block select registers BSR0–BSR7, which in combination with the firmware-controlled block address bits BA3–BA0 nominally addresses one of the sixteen separate blocks 0 to F. The selected BSR then outputs internal address bits AD16, AD15, AD14, AD13 or external address bits EA16, EA15, EA14, EA13 based on the block address bits BA3–BA0. The invention, however, re-sets the block address bits BA3–BA0 in a unique manner based on the block status table 30 when addressing internal memory. The condition of the block status table 30 of FIG. 1 corresponds to FIG. 7C and example #3, discussed below.

As shown in FIG. 3, the preferred block status table 30 contains sixteen entries, 0 to F. Many arrangements are possible depending on the size of the memory, the size of the program, and the system configuration. Here, however, the first twelve blocks identified by the bracket correspond to the blocks needed by the firmware, the first fourteen correspond to the available blocks 0 to block D in the electrically alterable memory (which may be reordered), the fifteenth corresponds to block E which contains the addresses of entries in the block status table 30, and the sixteenth corresponds to block F which is used for system ROM. The sixteen table entries are preferably located within the electrically alterable memory at predetermined hexadecimal addresses outside of the program space, e.g. within block E at $1C800 to $1C81F, and each entry preferably comprises one byte of data. The memory locations are preferably selected, as here, so that the least significant hexadecimal digit corresponds to one of sixteen positions, 0 to F, in the status table 30. Each byte of data in the block status table 30 contains Block ID Bits 31 and Block Status Bits 32. The Block ID Bits 31 identify the memory block ($0 to $F) at a given table position and preferably comprise the four LSBs of each entry in the table 30.

The Block Status Bits 32 indicate whether the memory block identified by corresponding Block ID Bits is "good" or "bad" and preferably comprises the four MSBs of each entry in the table 30. The Block Status Bits 32 can form a simple good/bad indicator for an entire 8K memory block which permits single-bit testing by the firmware. By way of example, the Block Status Bits 32 might be set to 0000 to indicate a "good" block and changed by only one bit to 1000 to indicate a "bad" block. Since there are four Block Status Bits 32, however, it is possible to provide more detailed information. The preferred block status table 30, therefore, uses the four Block Status Bits 32 to indicate the status of individual, 2K sub-blocks to allow possible use of the remaining "good" memory within a partially "bad" block. The bit values of 00001001, for example, indicate that all of block 9 is "good", the bit values of 11111001 indicates that all of block 9 is "bad", and the bit values of 10001001 indicate that the upper 2K sub-block is "bad" while the three lower 2K sub-blocks are "good." A partially "good" block would typically not be used for program storage since its "good" memory sections would not be sequential. A partially good memory block, however, could easily be used for data memory by providing for software examination of the block status table 30. This preferred approach, therefore, permits an 8K block that is only partially defective to be used for other data storage purposes even though it is not suitable for executing the firmware.

The above-described block status table 30 is created through a unique method. The table 30 is preferably created by testing the memory blocks within the electrically alterable memory, indicating their identity and status within the block status table 30, and then reordering the blocks within the block status table 30 so that any bad blocks found in the lower part of the table are "swapped" with extra good blocks from the upper part of the block status table 30. The block status table 30 is preferably contained in the electrically alterable memory.

Example #1 —FIG. 3 shows the preferred block status table 30 after testing where all fourteen memory blocks 0-D are "good." In this case, all of the Block Status Bits 32 are 0's and no reordering would occur. The Block ID Bits 31, therefore, are strictly sequential from position to position within the bracketed entries needed by the 96K program. Accordingly, the nominal addresses associated with the block select registers BSR0–BSR7 will simply be redirected to identically numbered physical addresses AD16, AD15, AD14, AD13.

Example #2 —FIG. 5A shows the preferred block status table 30 after testing where the upper 2K sub-block of block 6 is "bad." In this case, where block 6 is bad, the block status table 30 would be reordered to "swap" bad block 6 with the highest available good block, block D. Blocks E and F are not available for reordering because, in this embodiment, block E contains the block status table 30 and block F contains ROM memory that is not suitable for switching. FIG. 5B shows the table 30 after reordering, where position 6 ($1C806) now contains information about block D and, conversely, position D ($1C80D) now contains information about block 6. Significantly, all of the bracketed entries needed by the 96K program all point to good blocks.

Example #3 —FIG. 7A shows the block status table 30 after testing where the lower two 2K sub-blocks of block 2 and the upper 2K sub-block of block 9 are defective. The status table 30 would then be reordered. First, as shown in FIG. 7B, block 2 is swapped with block D because block 2 is the first sequential bad block within the memory and block D is the uppermost available good block. As before, Blocks E and F are not available for reordering. Next, as shown in FIG. 7C, bad block 9 is swapped with block C, the next available good block going downward from the last used good block, block D. As shown in FIG. 7C, the Bad Block Bits 31 at locations D and C contain sub-block status to allow possible use of the remaining good memory within blocks 2 and 9. As with Examples #1 and #2, the bracketed entries now all point to good blocks.

The block status tables 30 of FIGS. 3, 5B, or 7C are now ready to secretly "trump" the firmware's selection of block address bits BA3–BA0 during the "initialization" of one or more block select registers BSR0–BSR7 in the block select array 50. Once initialized, a block select register will "redirect" a nominal address to the good block it learned about from the block status table 30 during initialization. A nominal address to a good block will be "redirected" to a good block having the same number. A nominal address to a bad block, however, will be "redirected" to a good block having a different number.

Each block select register is automatically updated by appropriate hardware, as suggested by FIG. 1, whenever the firmware initializes a BSR by writing $FX(1111xxxx) to an address $0018–$001F corresponding to one of the block select register BSR0–BSR7. The xxxx portion specifies the block address bits BA3–BA0 of a desired block and, without the software's "knowledge," specifies a particular entry in the block status table 30, the Block ID Bits 31 of which will be copied to the block address bits BA3–BA0 of the BSR selected by the address $0018–$001F. The firmware must perform the initialization BSR by BSR but, in practice, would probably do so in sequential groups. Once initialized, a BSR will automatically output its contents (BA3, BA2, BA1, BA0) whenever it is selected by the three MSB's of the nominal address on the CPU's address bus 10. Some execution examples may be helpful.

Example #1—FIG. 4 shows the results of initializing block select register BSR1 in accordance with the block status table 30 of FIG. 3 by writing to BSR1 with the following assembly language commands:

LDA #F1

STA $19

This instruction sequence writes #F1 (11110001) to BSR1 ($0019) where "F" indicates that internal memory which may be good or bad and is subject to block substitution is being address and "1" designates the software desired memory block but, according to the present invention, is interpreted by the device as a location of a particular entry ($1C801) in the block status table 30 of FIG. 3. More particularly, as shown in FIG. 1, the "F" value enables the NAND gate 22, the "1" value is appended to a base address $1C80 loading to the block status table 30, and the write strobe 21 activates the NAND gate 22 and causes the hardware to copy Block ID Bits 31 of the entry at position "1" of the block status table 30 into BSR1. Here, position "1" of the table 30 still contains an entry for block 1 because block 1 was good.

Example #2—FIG. 6 shows the results of initializing the block select register BSR6 in accordance with the block status table 30 of FIG. 5B by executing the following commands:

LDA #F6

STA $1E

Here, the software expects to initialize the block address bits BA3–BA0 of BSR6 ($001E) with "6". As a result of writing #F6 to $001E, however, BSR6 is automatically loaded with "D" instead of "6" from entry 6 in the block status table 30 of FIG. 5B. Block select register BSR6 is now ready for future use whenever a "block 6"address appears on the address bus 10. In this way, the code may be written as though it is in block 6, i.e. addresses $0C000 to $0DFFF in a 128K memory using 16 blocks. It does not matter if block 6 is "bad," or not, because block select register BSR6 will supply the physical "block address" "D" that was stored therein during initialization based on "good/bad" information from the block status table 30 associated with this particular memory. As far as the firmware is concerned, it will get good block 6. The firmware has no knowledge of which actual physical address is being used.

Example #3 —FIG. 8 shows the results of initializing block select register BSR1 in accordance with the block status table of FIG. 7C and in order to nominally address block 9 in the upper 64K bank. Here, the firmware would execute the following commands:

LDA #F9

STA $19

This instruction sequence writes #F9 (11111001) to BSR1 ($0019) where "F" indicates that internal memory is being address and "9" designates the software desired memory block, but according to the present invention, is interpreted as a location of a particular entry ($1C809) in the block status table 30 of FIG. 7C.

As a result of writing #F9 to $0019, therefore, the block address bits BA3–BA0 of BSR1 are automatically set to "C" from entry 9 in the block status table 30 of FIG. 7C, rather than "9." Block select register BSR1 is now ready to nominally address "block 9" whenever a "block 1" address appears on the address bus 10. The firmware is aware of the bank switching scheme and expects, therefore, to get block 9. The firmware will not know that it actually gets block C.

In summary, by making the firmware initialize the block select registers as described above, the firmware can load and run with the belief that twelve contiguous blocks of good memory are available because, unbeknownst to the firmware, the block select registers BSR0–BSR7 in the block select array 50 will always address a good block even when the firmware tries to address a physical block that is bad. Each device, therefore, may have bad memory blocks in different amounts and in different locations, and the firmware may be compiled and loaded with the assumption that the code will be contained within contiguous memory blocks.

In essence, the method of the present invention is based upon a "mapping" of logical bus addresses to physical memory addresses. The application code generated for execution within this memory is always compiled with the assumption that contiguous addresses are available, without concern for the existence of bad memory. The method comprises testing each individual device at the time of manufacture to identify good blocks and bad blocks and storing the status of such blocks in a non-volatile memory within the device. The CPU is thereafter redirected to the good blocks when loading or executing the compiled application code so that the device's good blocks are used instead of the bad blocks.

The invention can be generalized as follows. Assume that the memory has n+1 equal sized blocks; block_0, block_1 up to block_n. If n is of sufficient size, and acceptable manufacturing yields provide n, n−1 or n−2 good blocks assuming that n−2 good blocks are required, loading the compiled code into the good blocks can proceed as follows. Let the three bad blocks in the example be block_a, block_b and block_c where block_a is the first identified bad block. Load the code targeted for block_a into block_n. Similarly load block_b code into block n−1 and blockc into block_n−2. The compiled code now exists in only good blocks. During operation the decoded output of the block select register causes the chosen memory block to become active. To change blocks, the memory controller must write to the block select register BSR0–BSR7 thus specifying a new memory block. The value written to the block select register first passes through a block status table 30 that is part of the electrically alterable memory. The block status table 30 is only programmed once at time of manufacture. If all blocks are good the table 30 contains a linear program. Therefore the ith location contains a value of i for all i from 0 to n.

The block status table swaps good and bad blocks as follows; refer to the example described earlier. Insert a value of n into location a, a value of n−1 into location b, a value of n−2 into location c, a value of a into location n, a value of b into location n−1, a value of c into location n−2 and a value of i into all other table locations. The value stored in the redundancy table replaces the value written by the software to the block select register.

The executing code calls for block_a by causing the memory controller to write a value of a to the block select register. The redundancy table replaces the value a with n and then stores the value n in the block select register, Thus the redundancy table automatically swaps block_n for block_a. This operation is transparent to the executing code.

Those skilled in the art will appreciated that various adaptations and modifications of the just-described preferred embodiment can be configured without departing from the scope and spirit of the invention. Therefore, it is to be understood that, within the scope of the appended claims, the invention may be practiced other than as specifically described herein.

We claim:

1. A method of providing redundancy in an electrically alterable memory divided into memory blocks for executing a program within the electrically alterable memory, the method comprising the steps of:

testing the electrically alterable memory to classify each memory block as a good memory block or a bad memory block;

creating a block status table within the electrically alterable memory which contains identity information and status information about the memory blocks;

intercepting a memory address on an address bus;

identifying a nominal memory block which contains the memory address; and substituting a known good memory block for the nominal memory block containing the memory address according to the block status table.

2. A method of transparently addressing a good memory block when nominally addressing a bad memory block in a memory divided into a plurality of equal size memory blocks, the method comprising the steps of:

testing the memory to identify good blocks and bad blocks;

creating a block status table containing block identity information and good/bad status information for each of the memory blocks in accordance with the testing step;

transferring the block identity information of the good memory block from the block status table to the block select register;

nominally addressing a memory block by setting bit values of a predetermined number of MSB's of an address bus controlled by a central processing unit executing a program that assumes that the nominally addressed memory block is good;

activating the block select register based on the bit values of the predetermined number of MSB's of the address bus; and outputting the block identity information of the activated block select register to address the good memory block instead of the nominally addressed memory block.

3. The method of claim 2 wherein the step of creating the block status table comprises the further steps of:

writing the good/bad status information for each memory block to a corresponding entry in the block status table; and reordering the entries in the block status table so that the block status table contains block identity information of the good blocks in a first sequence of contiguous entries and block identity information of the bad blocks in a second sequence of contiguous entries.

4. The method of claim 3 wherein the block status table is contained in the memory.

5. The method of claim 2 wherein the block identity information comprises an additional bit beyond the predetermined number of MSB's of the address bus available in the nominal addressing step, and wherein the method further comprises the step of setting the additional bit with firmware before the nominal addressing step to selectively address additional blocks of memory located in upper and lower halves.

6. The method of claim 2 wherein the memory is nonvolatile memory.

7. The method of claim 6 wherein the nonvolatile memory is flash memory.

8. The method of claim 6 wherein the nonvolatile memory is EEPROM.

9. The method of claim 2 wherein the block select register is addressable and wherein the step of transferring the block identity information of the good memory block from the block status table to the block select register occurs when writing to the block select register.

\* \* \* \* \*